United States Patent
Reiter et al.

(10) Patent No.: US 11,728,240 B2
(45) Date of Patent: Aug. 15, 2023

(54) CIRCUIT CARRIER ARRANGEMENT AND METHOD FOR PRODUCING SUCH A CIRCUIT CARRIER ARRANGEMENT

(71) Applicant: Vitesco Technologies GmbH, Hannover (DE)

(72) Inventors: Jens Reiter, Munich (DE); Rico Hartmann, Munich (DE); Christian Lammel, Munich (DE)

(73) Assignee: VITESCO TECHNOLOGIES GmbH, Hannover (DE)

( * ) Notice: Subject to any disclaimer, the term of this patent is extended or adjusted under 35 U.S.C. 154(b) by 123 days.

(21) Appl. No.: 17/392,301

(22) Filed: Aug. 3, 2021

(65) Prior Publication Data
US 2022/0044984 A1 Feb. 10, 2022

(30) Foreign Application Priority Data
Aug. 6, 2020 (DE) .................... 102020209923.5

(51) Int. Cl.
*H01L 23/40* (2006.01)
*H05K 1/18* (2006.01)
*H01L 25/11* (2006.01)

(52) U.S. Cl.
CPC .......... *H01L 23/4006* (2013.01); *H05K 1/18* (2013.01); *H01L 25/115* (2013.01); *H01L 2023/405* (2013.01); *H01L 2023/4062* (2013.01); *H01L 2023/4081* (2013.01); *H01L 2023/4087* (2013.01); *H05K 2201/09063* (2013.01);
(Continued)

(58) Field of Classification Search
CPC ............... H01L 23/4006; H01L 25/115; H01L 2023/405; H01L 2023/4062; H01L 2023/4081; H01L 2023/4087; H05K 1/18; H05K 1/184; H05K 1/021; H05K 2201/09063; H05K 2201/1059; H05K 2201/10598; H05K 2201/10757;
(Continued)

(56) References Cited

U.S. PATENT DOCUMENTS

2014/0035118 A1* 2/2014 Bayerer ............... H01L 25/072
                                                        438/122
2021/0066161 A1    3/2021 Kitahama et al.

FOREIGN PATENT DOCUMENTS

DE       10121969 C1   8/2002
DE    102013206299 A1  10/2014
FR        3097095 A1  12/2020

* cited by examiner

*Primary Examiner* — Laura M Menz
*Assistant Examiner* — Candice Chan
(74) *Attorney, Agent, or Firm* — Manelli Selter PLLC; Edward Stemberger

(57) ABSTRACT

A circuit carrier arrangement includes: a cooling plate (1) which has spacer and fastening elements (3) for connection to a printed circuit board (2) in a spaced-apart manner; a printed circuit board (2) which has bores (4) for receiving spring element sleeves (9); at least one power semiconductor component (10) which is connected by a soldered connection to the printed circuit board (2) and fastening elements (3) in the state in which it is fitted with the cooling plate (1) by means of plug-in connections (11) of spring-action configuration; and at least one spring element (5) having at least two spring element sleeves (9) between which a web (6) that is connected to the spring element sleeves (9) extends, and supporting elements (7) arranged on either side of said web and at least one spring plate (8) being arranged on said web.

7 Claims, 9 Drawing Sheets

(52) U.S. Cl.
CPC ............... *H05K 2201/1059* (2013.01); *H05K 2201/10598* (2013.01); *H05K 2201/10757* (2013.01)

(58) Field of Classification Search
CPC ......... H05K 2201/10166; H05K 3/308; H05K 3/3447; H05K 3/0061
See application file for complete search history.

CIRCUIT CARRIER ARRANGEMENT AND METHOD FOR PRODUCING SUCH A CIRCUIT CARRIER ARRANGEMENT

BACKGROUND

In common practice, power semiconductor components with plug-in connection wires, plug-in connections in the text which follows, are inserted into bores, provided for them, in a printed circuit board by means of so-called through hole technology (THT) and soldered to conductors, usually in the form of conductor tracks, and thermally connected directly to the housing, in which the circuit carrier arrangement comprising the power semiconductor components is accommodated, or to another cooling area. Here, a highly thermally conductive material can be installed between the cooling area and the power semiconductor component.

In order to achieve good heat transfer, a specific contact pressure is required here. This contact pressure is usually generated by means of springs. The springs are usually screwed or clamped in the housing. The main problem is with the order of fitting. At present, the printed circuit board with the power semiconductor components electrically and mechanically connected thereon by a soldering process is inserted into the housing or attached to the heat sink in the first instance. Then, the springs by way of which the required contact pressure is generated are fitted. For this purpose, the power semiconductor components have to project beyond the edge of the printed circuit board. Similarly, the screw-attachment points must not be covered by the printed circuit board. As a result, valuable cooling area, which is not available for the printed circuit board, is lost. This situation results in relatively large installation spaces and therefore relatively high costs.

DE 10 2013 206 999 A1 describes a controller for a motor vehicle. The controller has a housing, wherein at least one thermally conductive housing wall of the housing is formed from thermally conductive sheet metal and forms a heat sink. The controller has a printed circuit board which is arranged in a cavity that is enclosed by the housing. The controller has at least one power component, in particular a power semiconductor, wherein the power semiconductor is connected, in particular connected in a materially bonded manner, for example soldered, to the printed circuit board. The power semiconductor is configured as a surface-mounted component and is thermally conductively connected by way of a surface region to the thermally conductive housing wall.

In the case of this known controller, the thermally conductive housing wall is connected to the housing in a detachable manner. The thermally conductive housing wall has an embossed portion in a region that is situated opposite the power semiconductor, where the housing wall is led up to the power semiconductor byway of the embossed portion, so that a distance, in particular a gap dimension, between the housing wall and the power semiconductor before the embossing operation is larger than a distance, in particular a distance between the housing wall and the surface region, after the embossing operation. As a result, the gap dimension, and therefore the quantity of thermally conductive medium for bridging the distance between the surface region of the power semiconductor and the heat sink, specifically the thermally conductive housing wall, can be reduced.

The housing wall of the known controller has two contact-pressure domes which are formed in the housing wall at a distance from one another by means of deep-drawing and which extend toward the printed circuit board. The housing has a bearing for a contact-pressure spring, which is formed by an elastomer, in particular silicone rubber. The contact-pressure spring extends toward the contact-pressure dome and is configured to press the printed circuit board against the contact-pressure dome in the region of the contact-pressure dome. The controller has a further contact-pressure spring which is configured as a helical spring and is supported against the housing and is configured to press the printed circuit board against a further contact-pressure dome in the region of the further contact-pressure dome.

In the case of this known circuit carrier arrangement however, shear forces can be exerted onto the power semiconductor component during fitting and these shear forces can lead to damage to the solder points, in particular in the case of a power semiconductor component with plug-in connections.

SUMMARY

The object of the invention is to find a possible way of placing power semiconductor components with plug-in connections directly on the printed circuit board and to be able to allow contact-pressure forces to act only after the printed circuit board is fitted into the housing or onto the heat sink.

The object is achieved by a circuit carrier arrangement as claimed and by a method for producing such a circuit carrier arrangement as claimed. Advantageous developments of the invention are presented in the dependent claims.

Accordingly, provision is made of a circuit carrier arrangement comprising a cooling plate which has spacer and fastening elements for connection to a printed circuit board in a spaced-apart manner, comprising a printed circuit board which has bores for receiving spring element sleeves, comprising at least one power semiconductor component which is connected by a soldered connection to the printed circuit board on its side that faces the spacer and fastening elements in the state in which it is fitted with the cooling plate by means of plug-in connections of spring-action configuration, and comprising at least one spring element which is formed with at least two spring element sleeves between which a web that is connected to the spring element sleeves extends, supporting elements that extend perpendicularly in relation to the longitudinal direction of the spring element sleeves being arranged on either side of said web and at least one spring plate being arranged on said web, where the cooling plate, in the fitted state, has threaded elements that are axially aligned with the bores in the printed circuit board, where, in the state in which the printed circuit board is fitted with the cooling plate, screws are inserted through the spring element sleeves and are operatively connected to the threaded elements, where, in the non-clamped state of the at least one spring plate, with the screw not screwed in, said spring plate is arranged between the printed circuit board and the at least one power semiconductor component, and where, with the screw screwed in, the spring plate is pressed onto the power semiconductor component against the cooling plate.

A method for producing such a circuit carrier arrangement takes place with the steps of:
  fitting a spring element on the printed circuit board by inserting its spring element sleeves into the bores in the printed circuit board,
  fitting the at least one power semiconductor component on the printed circuit board by inserting its plug-in connections into holes, provided for them, in the printed circuit board and soldering the plug-in connections to conductor tracks on the printed circuit board, wherein the spring plates are positioned between the printed circuit board and an associated power semiconductor component, connecting the printed circuit board and the cooling plate, so that they are spaced apart from one another by the spacer and fastening elements, and the at least one power semiconductor component and the associated spring plate are positioned between the printed circuit board and the cooling plate, clamping the spring plate and as a result pressing the at least one power semiconductor component against the cooling plate by screwing in screws that are inserted in the spring element sleeves.

DETAILED DESCRIPTION OF EXAMPLE EMBODIMENTS

In order to allow an arrangement of the power semiconductor components on the printed circuit board in as space-saving a manner as possible, the order of fitting is adapted. In this case, the spring element is already placed between the printed circuit board and the power semiconductor component before the soldering process.

In order to prevent the spring element influencing the soldering process, the spring element rests on specially shaped supporting elements on the printed circuit board during the soldering process to non-clamped spring plates. At the end of the spring element, spring element sleeves are formed from the sheet-metal material. The entire spring element is fixed in a sufficiently accurately defined position with the aid of these spring element sleeves through two holes in the printed circuit board. After the soldering process, the printed circuit board with the soldered-in power semiconductor components is fitted into the housing. In this case, the spring plates of the spring elements are still not clamped. After the fitting is complete, the at least one spring plate is clamped with the aid of the two screws. As a result, the power semiconductor components are pressed onto the cooling device or into the thermally highly conductive material. In order to protect the solder point during fitting and the clamping process, the connection limbs or plug-in connections of a power semiconductor component are specially shaped or bent. This bent shape results in a spring action which absorbs the forces during fitting and the clamping process and does not pass on said forces to the solder point.

Owing to the particular shape of the spring element, it is possible to place the power semiconductor components entirely beneath the printed circuit board and therefore to increase the usable printed circuit board area. Furthermore, it is no longer necessary to position the circuit of the power semiconductor components at the edge of the printed circuit board. This allows a relatively high degree of freedom when configuring and distributing the entire circuit on the printed circuit board. Therefore, it is possible to use virtually the entire area, apart from two holes, for mounting components.

Shaping the spring element sleeves of a spring element is advantageous in two respects: Firstly, the spring element sleeves act as a preliminary guide for the spring element during the fitting process and, owing to the spring element sleeves projecting through the printed circuit board, the spring element is held in a sufficiently accurate position during the entire process, until it is finally fixed with the aid of the two screws. The second advantage arises during the screwing process. The screw heads are held at a specific point above the printed circuit board owing to the shape of the spring elements. This results in very good access to the screw heads. An automatic screwing process even with a relatively large feed is rendered possible in this way. The preferably at least three supporting elements of a spring element allow the spring element to stand on the printed circuit board securely and without tilting during the soldering process. In this case, the spring element is not in contact with the power semiconductor components. As a result, the spring element is prevented from having a negative influence on the soldering process. The special bent shape of the connection limbs of the power semiconductor components produce a spring action. This is used to minimize the actions of force during the fitting and clamping process. The partial decoupling of plastic bodies of a power semiconductor component and the solder point also has an effect during operation of the assembly. The service life of the solder point can be increased with the aid of this measure.

In one embodiment of a circuit carrier arrangement, the plug-in connections are of s-shaped or wave-like configuration. As a result, they deploy the desired spring action.

The spring elements are advantageously constructed such that a plurality of spring plates can be arranged on only one web. Therefore, only two spring element sleeves are sufficient for several power semiconductor components for preliminary fitting and for clamping the spring plates.

In this case, the spring plates can be arranged on either side of the web.

In a further embodiment of a circuit carrier arrangement, a supporting element of a spring element is formed by bending a spring plate close to the web of the spring element.

As a result, a relatively low overall height of the circuit carrier arrangement can be achieved.

In one embodiment of a circuit carrier arrangement, the spring element sleeves have a longitudinal slot and have a radial spring action. This may be the case, in particular, when a spring element of a circuit carrier arrangement, which spring element is formed with spring element sleeves, a web, at least one spring plate and supporting elements, is advantageously produced from a sheet-metal part by stamping and bending.

The screws for clamping the spring plates can be inserted into the spring element sleeves before or after the printed circuit board and the cooling plate are connected.

BRIEF DESCRIPTION OF THE DRAWINGS

The invention is intended to be explained in more detail below on the basis of an exemplary embodiment with the aid of figures, in which.

DETAILED DESCRIPTION OF EXAMPLE EMBODIMENTS

Figure 1:
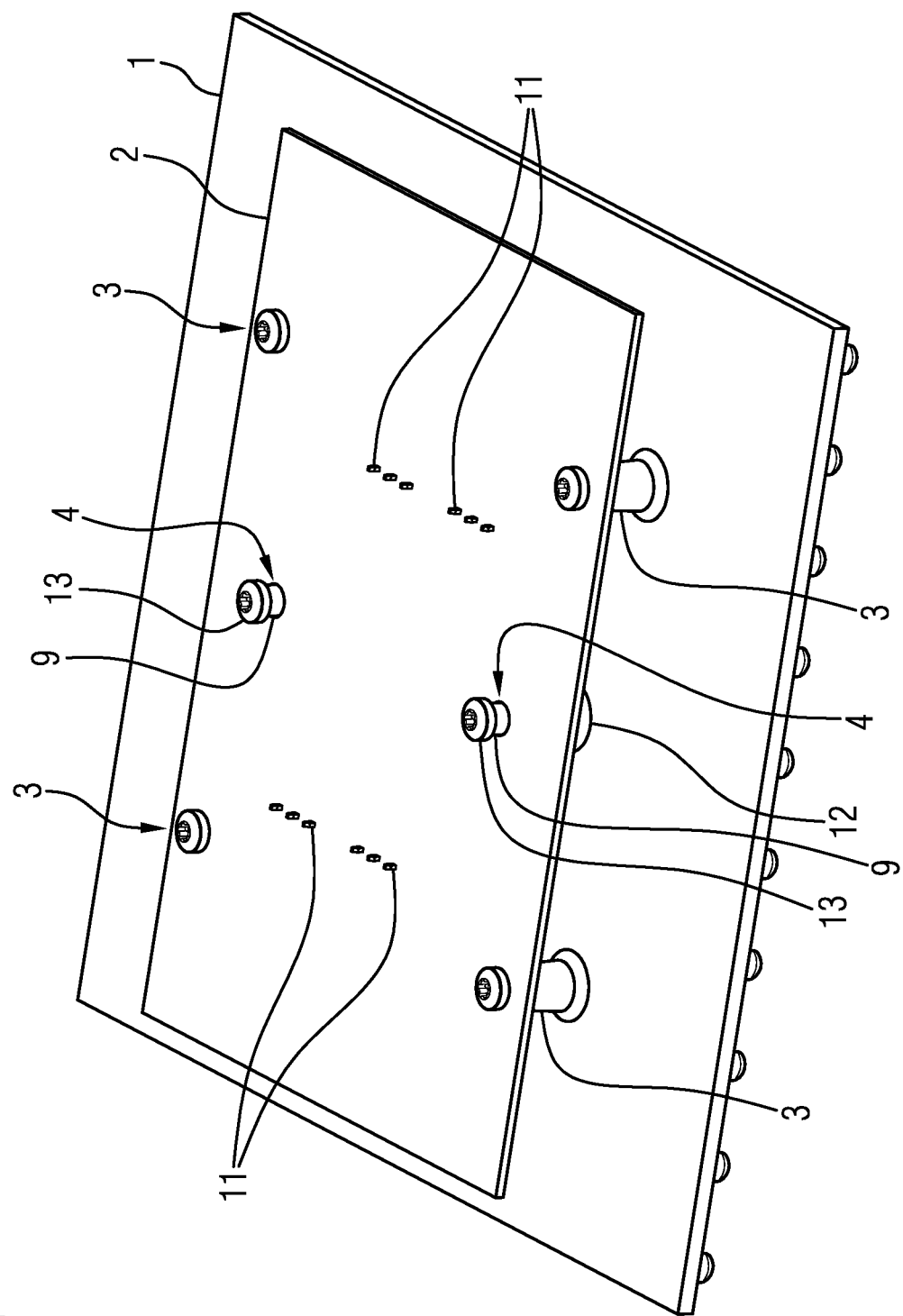
FIG. 1 shows a perspective top view of a circuit carrier arrangement.
Figure 2:
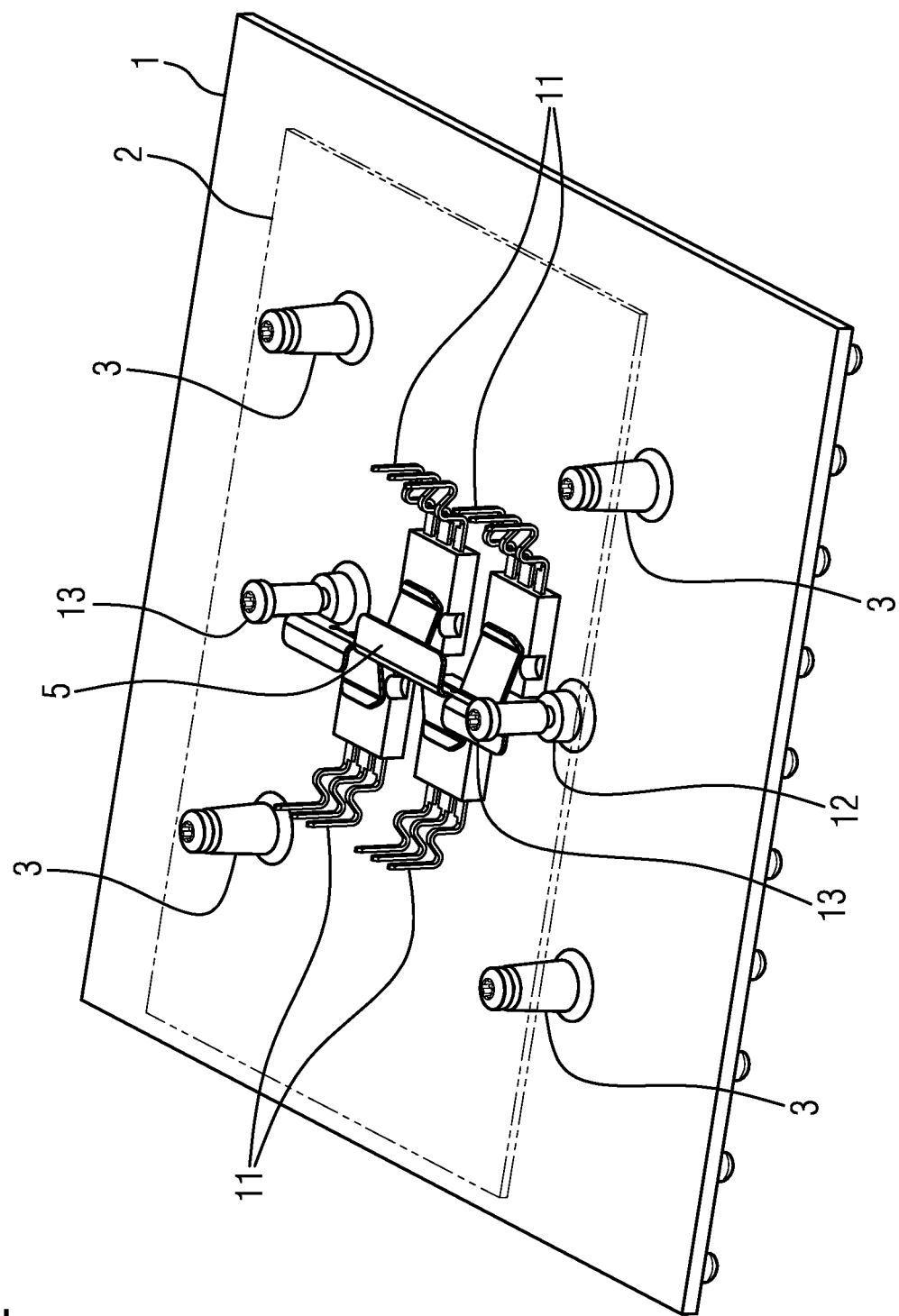
FIG. 2 shows a perspective top view of a circuit carrier arrangement with a transparent printed circuit board.
Figure 3:
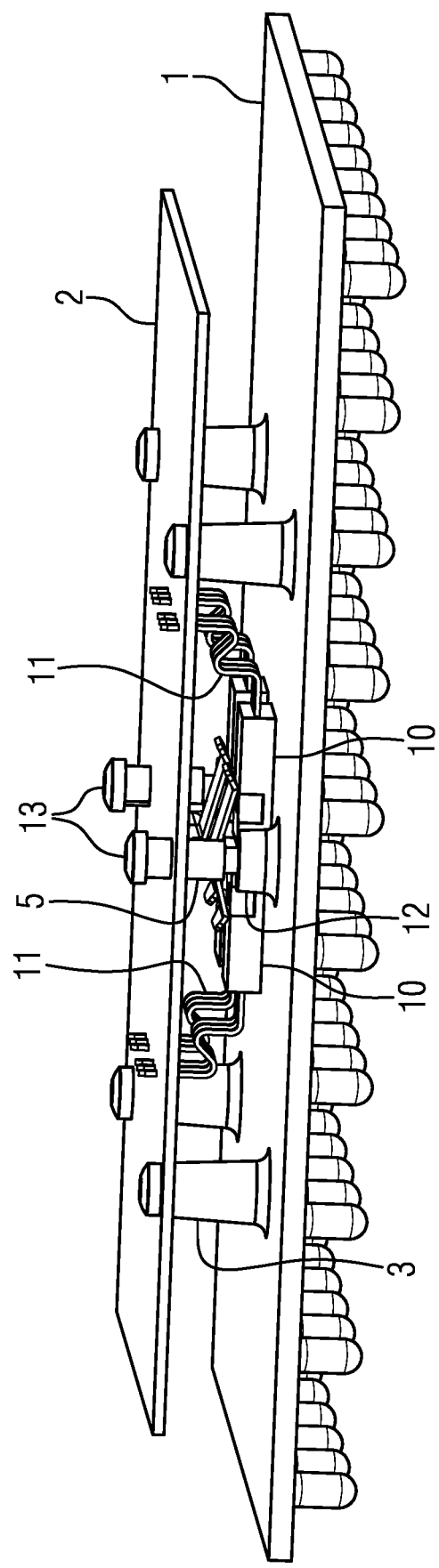
FIG. 3 shows a perspective side view of a circuit carrier arrangement.
Figure 4:
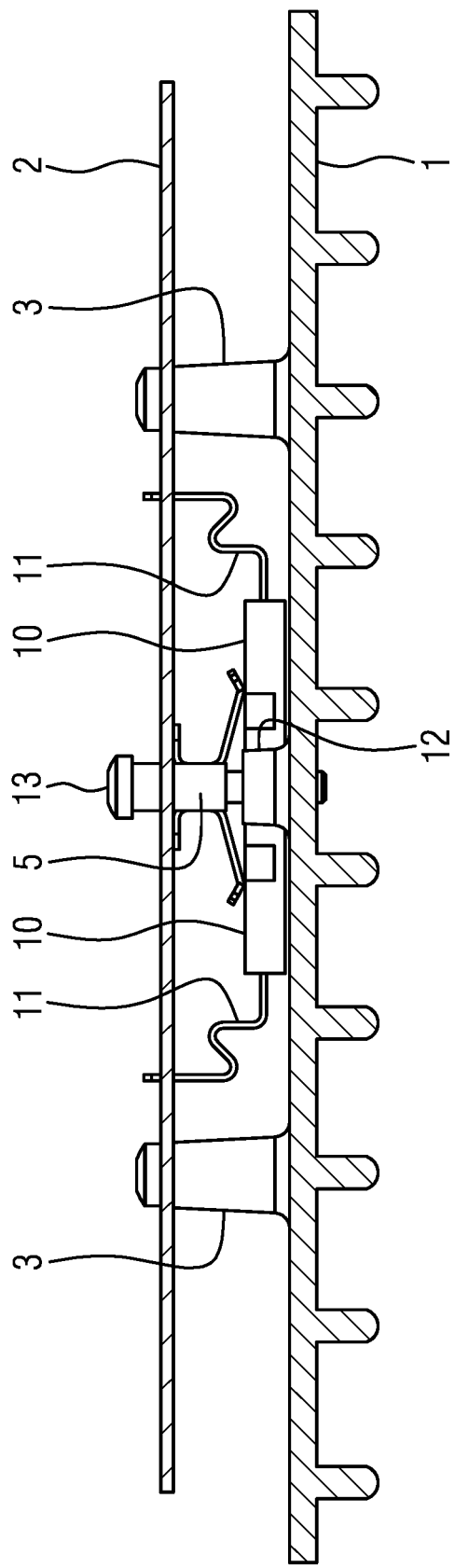
FIG. 4 shows a circuit carrier arrangement from the side.
Figure 5:
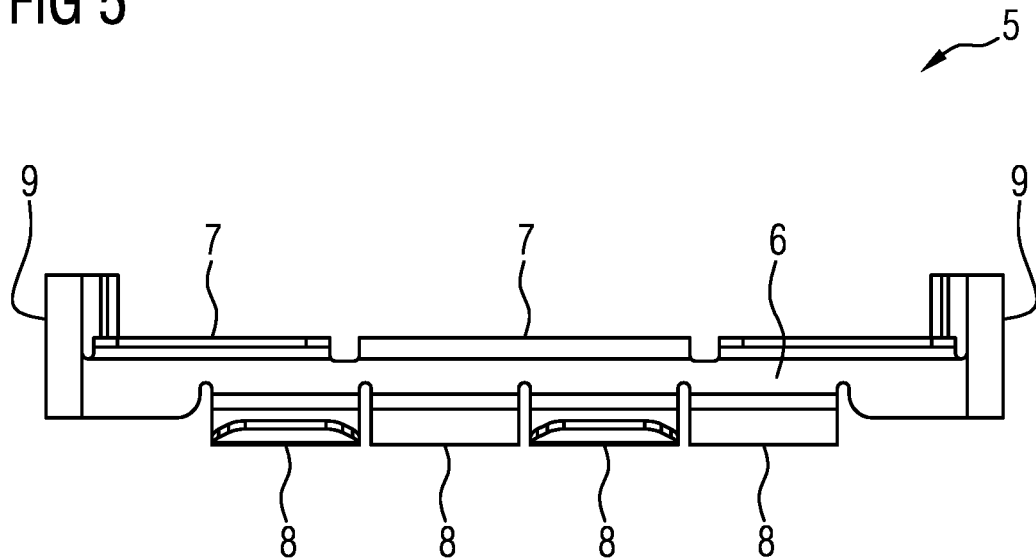
FIG. 5 shows a spring element from the front.
Figure 6:
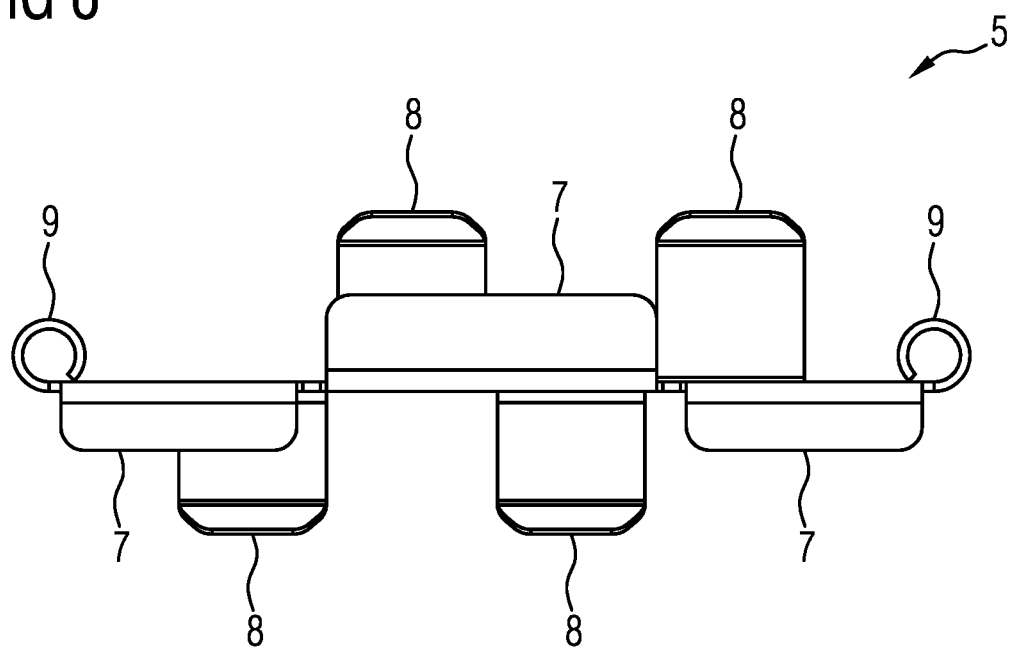
FIG. 6 shows a spring element from behind.
Figure 7:
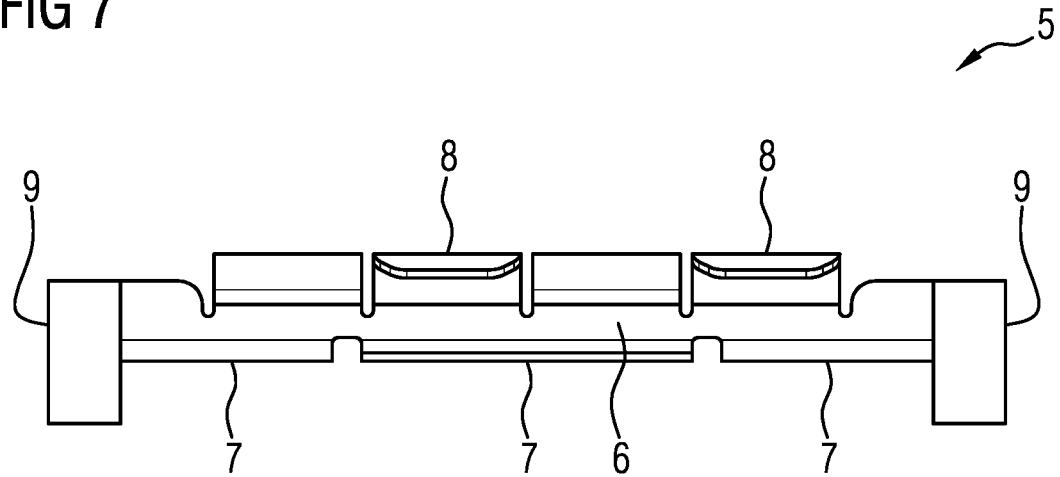
FIG. 7 shows a spring element from above.
Figure 8:
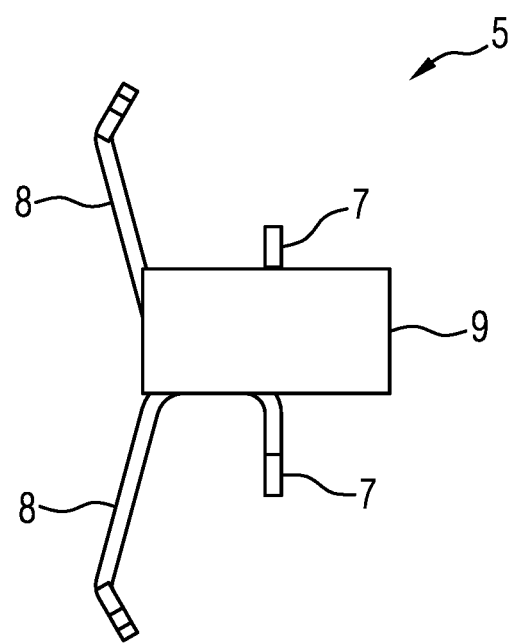
FIG. 8 shows a spring element from the side.
Figure 9:
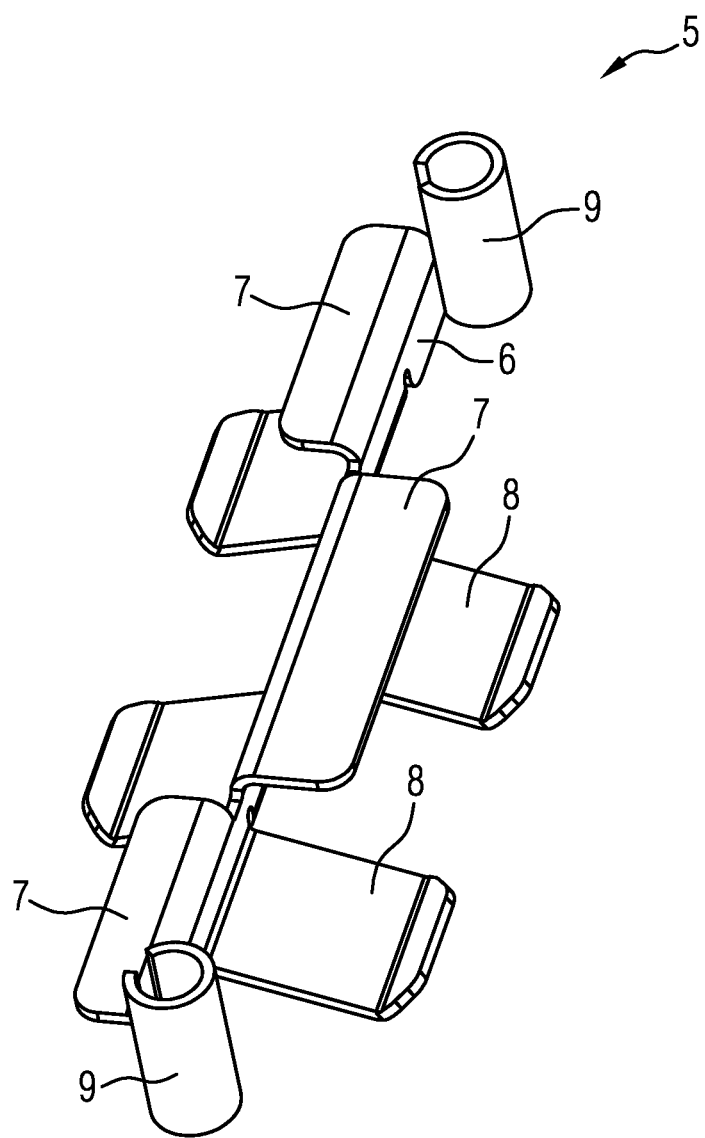
FIG. 9 shows a perspective view of a spring element.

FIGS. 1 to 4 show, in various viewing angles, perspective illustrations of circuit carrier arrangements which realize the concept according to the invention and are produced using the method according to the invention. In FIG. 2, a view is selected in which the printed circuit board 2 is illustrated in a transparent manner in order to allow the underlying arrangement of the power semiconductor components 10 and spring elements 5 to be seen.

Such a circuit carrier arrangement is formed with a cooling plate 1 which is connected to a printed circuit board 2 by means of spacer and fastening elements 3. The printed circuit board 2 can be populated with any desired circuit arrangement comprising a wide variety of electrical and electronic components, where, in particular, power semiconductor components 10 are connected to the printed circuit board 2 by means of plug-in connections 11. The plug-in connections 11 are inserted through holes, in particular bores, in the printed circuit board 2 and then soldered to conductor tracks (not illustrated) that are fitted on the printed circuit board 2. Such soldered connections are sensitive to mechanical loads, and therefore the plug-in connections 11 are configured as spring-action plug-in connections, in particular in an approximately s-shaped or wave-like manner.

The printed circuit board 2 has bores 4 into which spring element sleeves 9 of a spring element 5 are inserted in the illustrated exemplary embodiment of FIGS. 1 to 4. In this case, the spring element 5 has supporting elements 7 (FIGS. 5 to 9), where the spring element sleeves 9 are inserted so far into the bores 4 in the printed circuit board 2 that the supporting elements 7 come into contact with the printed circuit board 2 and accordingly support the spring element 5 on the printed circuit board 2.

After the spring element sleeves 9 are inserted into the bores 4 in the printed circuit board 2, the power semiconductor components 10 are soldered to the printed circuit board 2 by means of their plug-in connections 11, where, in this fitting situation, the power semiconductor components 10 are not in contact with the spring plates 8 of the spring elements 5. As a result, the plug-in connections 11 and therefore also their soldered connections to the printed circuit board 2 are relieved of mechanical loading.

The cooling plate 1 has threaded elements 12 into which screws 13, which are inserted into the spring element sleeves 9 of the spring element 5, are operatively connected, in particular are screwed to them. In this case, the screws 13 can have an external thread, where the threaded elements 12 then accordingly have an internal thread, but the reverse is also possible. When the screws 13 are screwed into the threaded elements 12, the spring element sleeves are then moved in the direction of the cooling plate 1 and therefore the spring plates 8 are pressed onto the power semiconductor components 10, where these are pressed against the cooling plate 1.

The process of screwing the screws 13 takes place only after the printed circuit board 2 has been connected to the cooling plate 1 by means of the spacer and fastening elements 3. In this case, the screws 13 can be inserted into the spring element sleeves 9 before the printed circuit board 2 is connected to the cooling plate 1, or only thereafter.

FIGS. 5 to 9 show various views of a spring element 5. The spring element 5 is preferably produced from a sheet-metal strip which is correspondingly punched out, where the tabs implemented in this way are shaped by bending over to form supporting elements 7, spring plates 8 and spring elements 9. The entire assembly is held together by a web 6 which forms the middle of the original metal sheet. As can be gathered from the perspective view in FIG. 9 in particular, three supporting elements 7 are provided, which supporting elements therefore form a particularly stable three-legged unit with which the spring element 5 can be positioned in a stable manner when it is inserted into the bores 4 in the printed circuit board 2, so that a defined position of the spring plates 8 in relation to the power semiconductor components 10 can be achieved.

Figure 10:
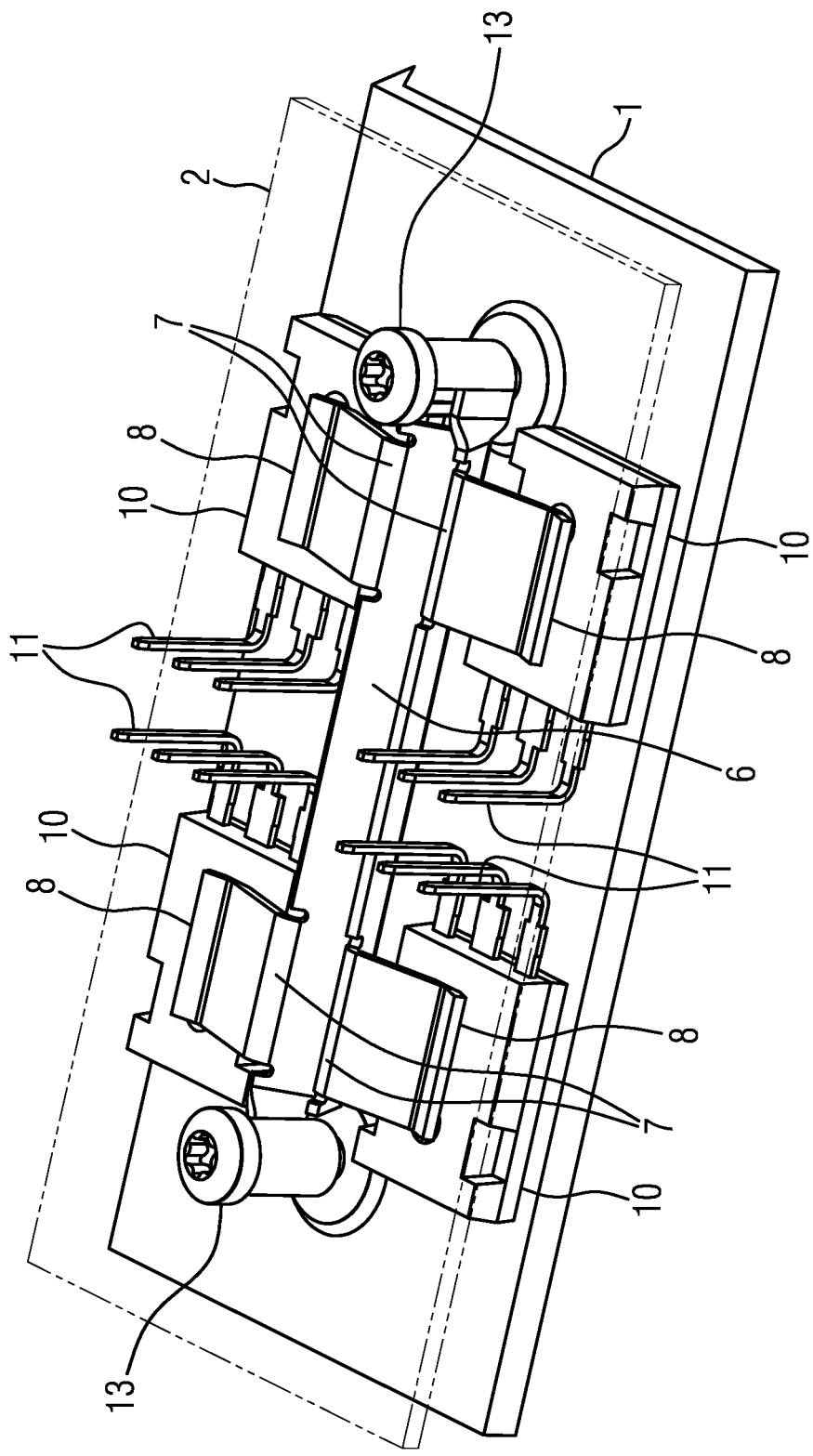
FIG. 10 shows a perspective top view of a circuit carrier arrangement with a transparent printed circuit board with an alternative spring element.

FIG. 10 shows a further perspective illustration of a circuit carrier arrangement which likewise realizes the concept according to the invention and is produced using the method according to the invention. Here too, as in FIG. 2, a view is selected in which the printed circuit board 2 is illustrated in a transparent manner in order to allow the underlying arrangement of the power semiconductor components 10 and alternative spring elements 5 to be seen. In the case of this alternative spring element 5, a supporting element 7 is formed by bending a spring plate 8 close to the web 6. In this case, the bend forms that point of the spring plate 8 that is situated closest to the printed circuit board 2 and supports the spring element 5 on the printed circuit board 2 in the non-clamped state. A relatively low overall height can be achieved owing to this variant of a spring element 5.

Figure 11:
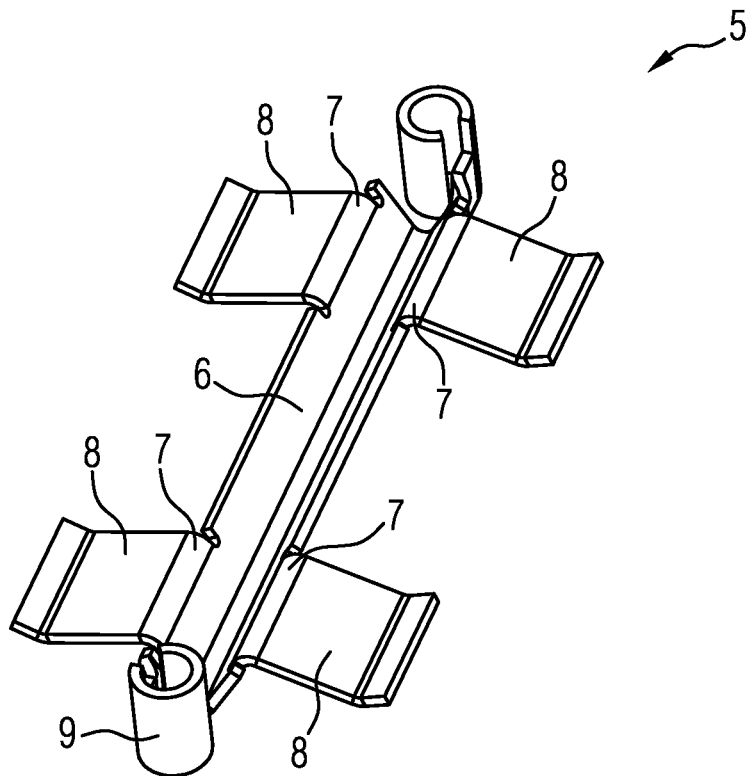
FIG. 11 shows a perspective view of an alternative spring element.
Figure 12:
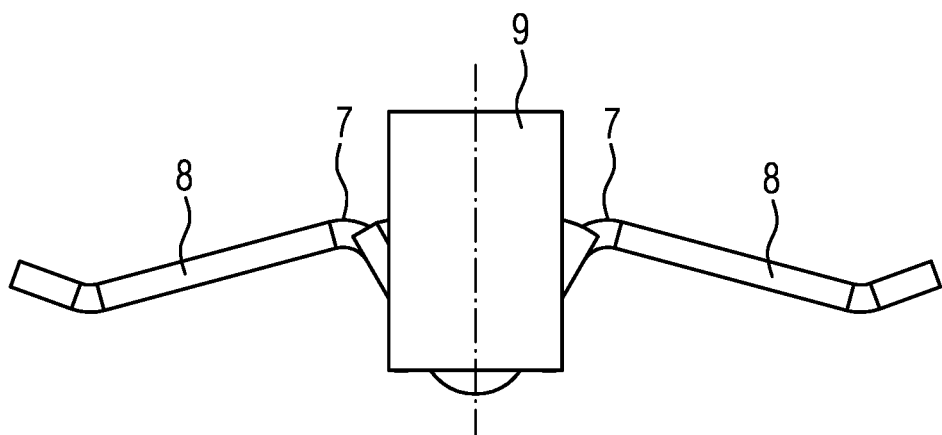
FIG. 12 shows an alternative spring element from the side.

FIGS. 11 and 12 show a perspective view and a side view of the alternative spring elements 5. It can be clearly seen in FIG. 12 that bending a spring plate 8 close to the web 6 forms that point of the spring plate 8 that is situated closest to the printed circuit board 2. In this case, the printed circuit board 2 is intended to be above the spring element 5 based on the view in FIG. 12, as can also be seen in FIG. 10.

The spring element sleeves 9 are likewise formed from the original stamped metal sheet and as a result have a longitudinal slot which leads to the spring element sleeves 9 being of spring-action configuration in the axial direction and therefore being able to be inserted particularly easily into bores 4 in the printed circuit board 2, without compliance with low, prespecified tolerances having to be taken into consideration in the process on account of a required press fit.

Owing to this advantageous spring element 5 and the order according to the invention of fitting of the spring element 5 and the power semiconductor component 10 and the connection of the printed circuit board 2 to the cooling plate 1, a particularly simple and cost-effective circuit carrier arrangement with well cooled power semiconductor components 10 is produced.

What is claimed is:
1. A circuit carrier arrangement comprising:
   a cooling plate (1) which has spacer and fastening elements (3) for connection to a printed circuit board (2) in a spaced-apart manner,
   a printed circuit board (2) which has bores (4) for receiving spring element sleeves (9),
   at least one power semiconductor component (10) which is connected by a soldered connection to the printed circuit board (2) on its side that faces the spacer and fastening elements (3) in the state in which it is fitted with the cooling plate (1) by means of plug-in connections (11) of spring-action configuration, and
   at least one spring element (5) which is formed with at least two spring element sleeves (9) between which a web (6) that is connected to the spring element sleeves (9) extends, and supporting elements (7) that extend perpendicularly in relation to the longitudinal direction of the spring element sleeves (9) being arranged on either side of said web and at least one spring plate (8) being arranged on said web, wherein the cooling plate (1), in the fitted state, has threaded elements (12) that are axially aligned with the bores (4) in the printed circuit board (2), and wherein, in the state in which the printed circuit board (2) is fitted with the cooling plate (1), screws (13) are inserted through the spring element sleeves (9) and are operatively connected to the threaded elements (12), so that, in the non-clamped state of the at least one spring plate (8), with the screw (13) not screwed in, said spring plate is arranged between the printed circuit board (2) and the at least one power semiconductor component (10), and, with the screw (13) screwed in, the spring plate (8) is pressed onto the power semiconductor component (10) against the cooling plate (1).

2. The circuit carrier arrangement as claimed in claim 1, wherein the plug-in connections (11) are of s-shaped or wave-like configuration.

3. The circuit carrier arrangement as claimed in claim 1, wherein a plurality of spring plates (8) are arranged on the web (6).

4. The circuit carrier arrangement as claimed in claim 3, wherein the spring plates (8) are arranged on either side of the web (6).

5. The circuit carrier arrangement as claimed in claim 1, wherein the spring element sleeves (9) have a longitudinal slot and have a radial spring action.

6. The circuit carrier arrangement as claimed in claim 1, wherein a spring element (5), which is formed with the spring element sleeves (9), the web (6), at least one spring plate (8) and the supporting elements (7), is produced from a sheet-metal part by stamping and bending.

7. The circuit carrier arrangement as claimed in claim 1, wherein a supporting element (7) of a spring element (5) is formed by bending a spring plate (8) close to the web (6) of the spring element (5).

* * * * *